United States Patent
Fariello et al.

[11] Patent Number: 6,133,886
[45] Date of Patent: Oct. 17, 2000

[54] ANTENNA FOR A WIRELESS COMMUNICATION MODULE

[75] Inventors: Patrick L. Fariello; Glenn R. Nelson, both of Boynton Beach, Fla.

[73] Assignee: Motorola, Inc., Schaumburg, Ill.

[21] Appl. No.: 09/345,863

[22] Filed: Jul. 1, 1999

[51] Int. Cl.[7] .............................. H01Q 1/24; H01Q 11/12
[52] U.S. Cl. ..................... 343/702; 343/841; 343/842; 343/744
[58] Field of Search ..................... 343/702, 841, 343/842, 850, 852, 866, 870, 741, 744; H01Q 1/24, 11/12

[56] References Cited

U.S. PATENT DOCUMENTS

| | | | |
|---|---|---|---|
| 5,113,196 | 5/1992 | Ponce de Leon et al. | 343/702 |
| 5,300,938 | 4/1994 | Maroun et al. | 343/702 |
| 5,469,178 | 11/1995 | Nguyen et al. | 343/702 |
| 5,673,054 | 9/1997 | Hama | 343/744 |
| 5,880,697 | 3/1999 | McCarrick et al. | 343/702 |
| 6,031,494 | 2/2000 | Okabe et al. | 343/702 |

*Primary Examiner*—Hoanganh Le
*Attorney, Agent, or Firm*—Randi L. Dulaney

[57] ABSTRACT

An antenna (28) for use in a wireless communication module (10) includes a shield plate (40), an antenna loop element (42), and a transmission line element (44). The wireless communication module (10) also includes a receiver (37) having a circuit board (30). The shield plate (40) is located on a first side (32) of the circuit board (30); and the antenna loop element (42) and the transmission line element (44) are located on an opposite side (34) of the circuit board (30). The shield plate (40) is electrically connected to a first loop end (50) of the antenna loop element (42). A capacitor (64) interconnects a second loop end (52) of the antenna loop element (42) to a first transmission line end (58) of the transmission line element (44). A second transmission line end (60) is electrically open.

14 Claims, 6 Drawing Sheets

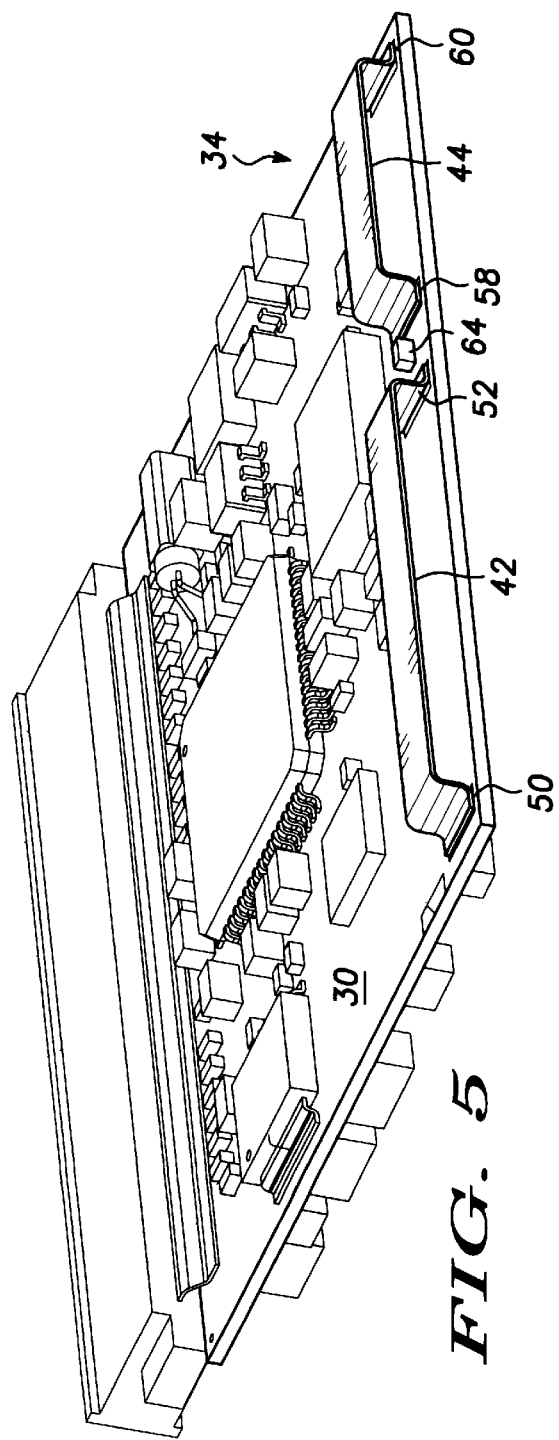
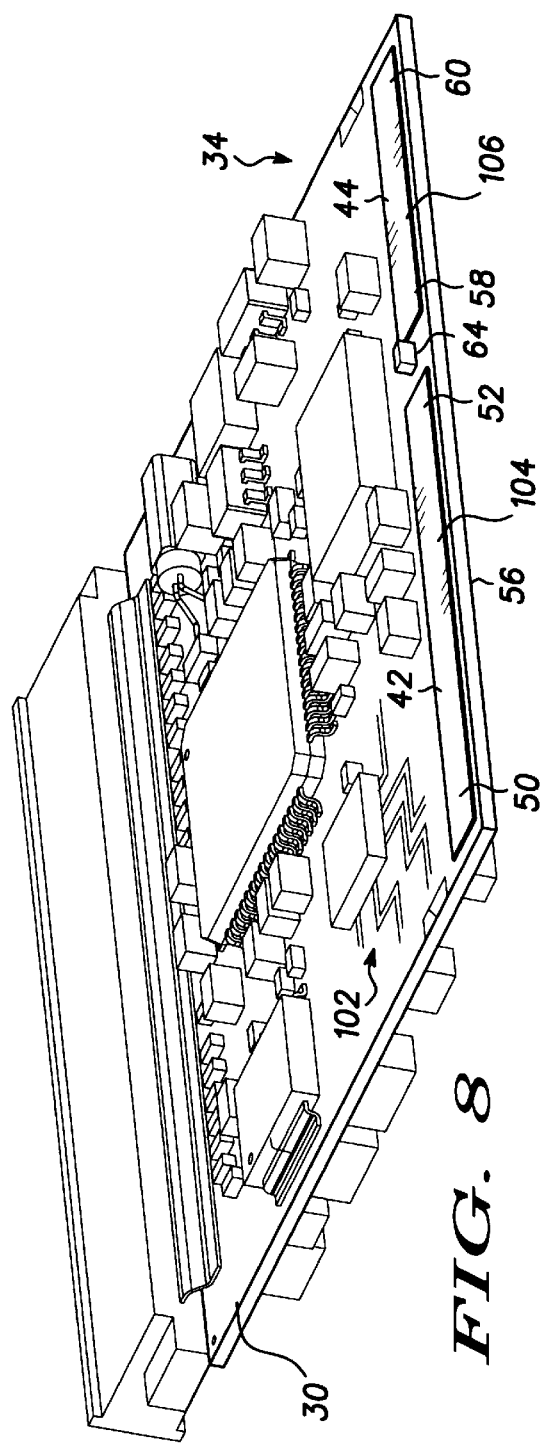

ANTENNA FOR A WIRELESS COMMUNICATION MODULE

FIELD OF THE INVENTION

This invention relates in general to antennas, and in particular to an antenna for use in a wireless communication module.

BACKGROUND OF THE INVENTION

Portable wireless communication devices such as pagers and cellular phones are extensively used today. For example, conventional wireless messaging devices give the user full text capability and make return phone calls less necessary by providing access to everything from a quick way to get to information on the meetings for the day to the local movie listings to the latest global news update. The more elaborate, customizable wireless messaging devices combine the benefits and flexibility of two-way messaging, software applications and personal computer connectivity with the wearability and convenience of a conventional wireless messaging device.

Electronic computing devices are also extensively used today. The portability of the new electronic organizers combined with their longer battery life, larger memories, and safe storage of information has caused a growth in popularity of these devices over the past few years. Increased efficiency from functions such as the synchronization with a personal information manager has proven a major benefit for users in both their personal and business lives.

Recently, there is a trend towards the integration of wireless communication devices and both portable and fixed types of electronic computing devices. Manufacturers of wireless communication devices, manufacturers of electronic computing devices, and wireless service providers are teaming up to produce these integrated services and products including wireless applications capable of receiving text, numeric, and binary messages from the wireless communication modules. These enterprise and consumer applications give electronic computing users the capability to receive wireless e-mail, up-to-the-minute news and stock reports, remote updates on interest rates and financial information, weather warnings, and many other capabilities whose applications are yet to be imagined. The integration of these two complimentary devices also allows corporations to develop mission-critical solutions that keep their mobile workers updated with vital information such as price lists, competitive news, and calendar updates.

Two problems resulting from the integration of wireless communication modules and electronic computing devices are the limited antenna space for the wireless communication module and the degradation of performance of the wireless communication module due to electromagnetic interference (EMI) from the electronic computing device EMI can affect an electronic system either by the mechanism of conduction, radiation, or a combination of both. EMI control is a difficult design aspect for wireless communication module integration into the electronic computing device since there are so many combinations of EMI sources and mechanisms in the electronic computing device. Additionally, the very high sensitivity of the wireless communication module's receiver and the close proximity of its antenna to the circuitry of the electronic computing device make it very susceptible to EMI. This high noise environment creates receiver desensitization when the undesired EMI signal occurs at the same frequency as the receive frequency, or at a number of other frequencies sensitive to the receiver circuitry (such as the intermediate frequency). Since the receiver cannot differentiate between the desired and undesired signals, the undesired signal can block out the desired signal to desensitize or lower the sensitivity threshold of the receiver. If the amplitude level of the undesired signal can be lowered enough using EMI control techniques, the receiver's sensitivity threshold is not degraded or degraded an allowable amount.

Typically, EMI control is accomplished by re-designing the electronic computing device with EMI techniques in mind. For example, making the housing of the electronic computing device a shielded box, using a dedicated circuit board layer as the ground-plane, using a ground-plane area underneath the wireless communication module, or modifying the electronic circuit design to reduce the EMI emissions from the electronic computing device. Since the electronic computing device is usually already in existence, and most manufacturers do not want to make changes to their electronic computing device, these type of major design modifications are not desirable.

What is needed is a wireless communication module with reduced susceptibility to the EMI emissions of the electronic computing device which fits within the space limitations of the electronic computing device.

BRIEF DESCRIPTION OF THE DRAWINGS

FIG. 5 is an illustration of one side of the wireless communication module of FIG. 3;

FIG. 8 is an illustration of another embodiment of the antenna used in the wireless communication module of FIG. 3.

DESCRIPTION OF THE PREFERRED EMBODIMENT

Figure 1:
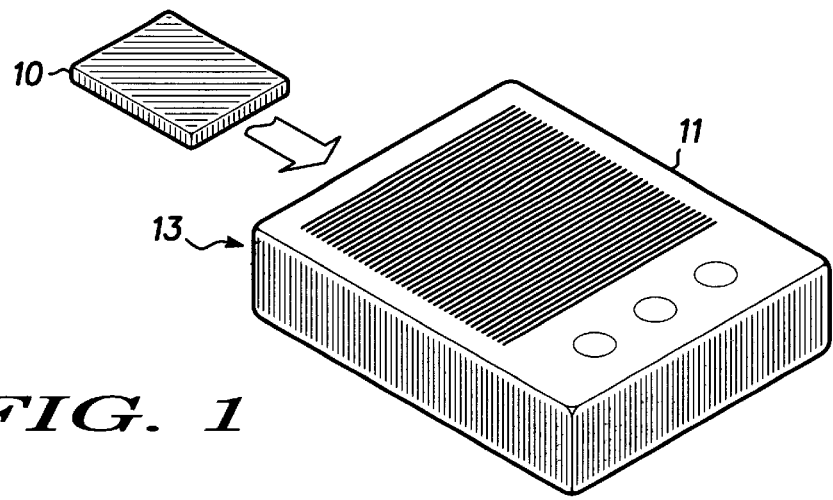
FIG. 1 is an illustration of a conventional integration of a wireless communication module and an electronic computing device.

Referring to FIG. 1, a wireless communication module 10 and an electronic computing device 11 are illustrated. In one embodiment, as shown in FIG. 1, the wireless communication module 10 is a stand-alone messaging card designed to fit inside the accessory slot located at a top edge 13 of the electronic computing device 11. For example, the messaging card may be designed to fit inside the compact flash accessory slot of a handheld personal digital assistant. In another embodiment, the wireless communication module 10 is integrated directly into the electronic computing device 11. For example, the components of the wireless communication module 10 may be located directly on the circuit board of a personal computer. It will be appreciated that other similar configurations for integration of the wireless communication module 10 into the electronic computing device 11 may be utilized without departing from the present invention. In the following description, the wireless communication module 10 refers to any of the types of wireless communication modules mentioned above or an equivalent.

Figure 2:
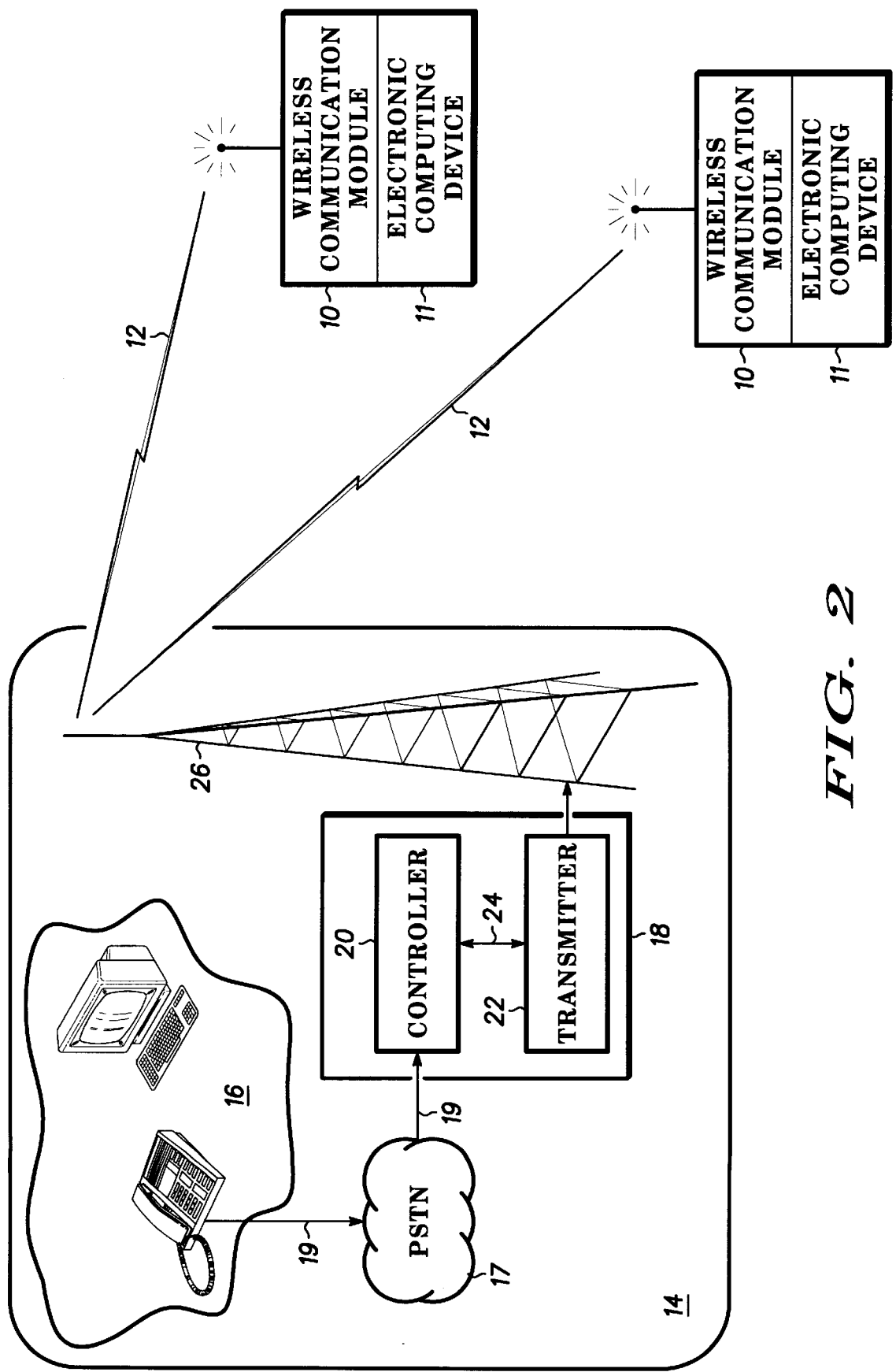
FIG. 2 is a block diagram of a wireless communication system in which the wireless communication module of FIG. 1 operates.

As shown in FIG. 2, the wireless communication module 10 receives transmissions 12 from a wireless communication system 14 on at least one radio frequency (RF) channel. It will be appreciated that the wireless communication system 14 may function utilizing any wireless RF channel, for example, a one or two way pager channel, a mobile cellular channel, or a mobile radio channel. Similarly, it will be appreciated that the wireless communication system 14 may function utilizing other types of wireless channels such as infrared channels. In the following description, the wireless communication system 14 refers to any of the wireless communication systems mentioned above or an equivalent.

The wireless communication system 14 includes a message source 16 such as a telephone, a computer, or a service operator. The message source 16 communicates with a transmission source 18. This communication for example may be by way of a conventional public switched telephone network (PSTN) 17 by conventional telephone links 19.

The transmission source 18 includes a controller 20 and at least one transmitter 22. The controller 20 oversees the operation of the transmitter 22 through one or more communication links 24, which may be twisted pair telephone wires, radio frequency (RF), microwave, or high quality audio communication links. As is conventional, the controller 20 digitally encodes and schedules the outbound transmissions 12 by the transmitter 22 via the transmit antenna 26 to a plurality of wireless communication modules 10 connected to or integrated within electronic computing devices 11.

Utilizing a conventional wireless communication system 14 as illustrated in FIG. 2 expands the capabilities and utility of the electronic computing device 11 by creating a fast, easy path between the message source 16 and the electronic computing device 11. For example, the message source 16 may be a personal computer sitting on the office desk of the owner of the electronic computing device 11. Using wireless synchronization through the wireless communication module of the personal information management application located on the personal computer with a compatible personal information management application on the electronic computing device allows up to the minute updates to easily occur on both devices.

Figure 3:
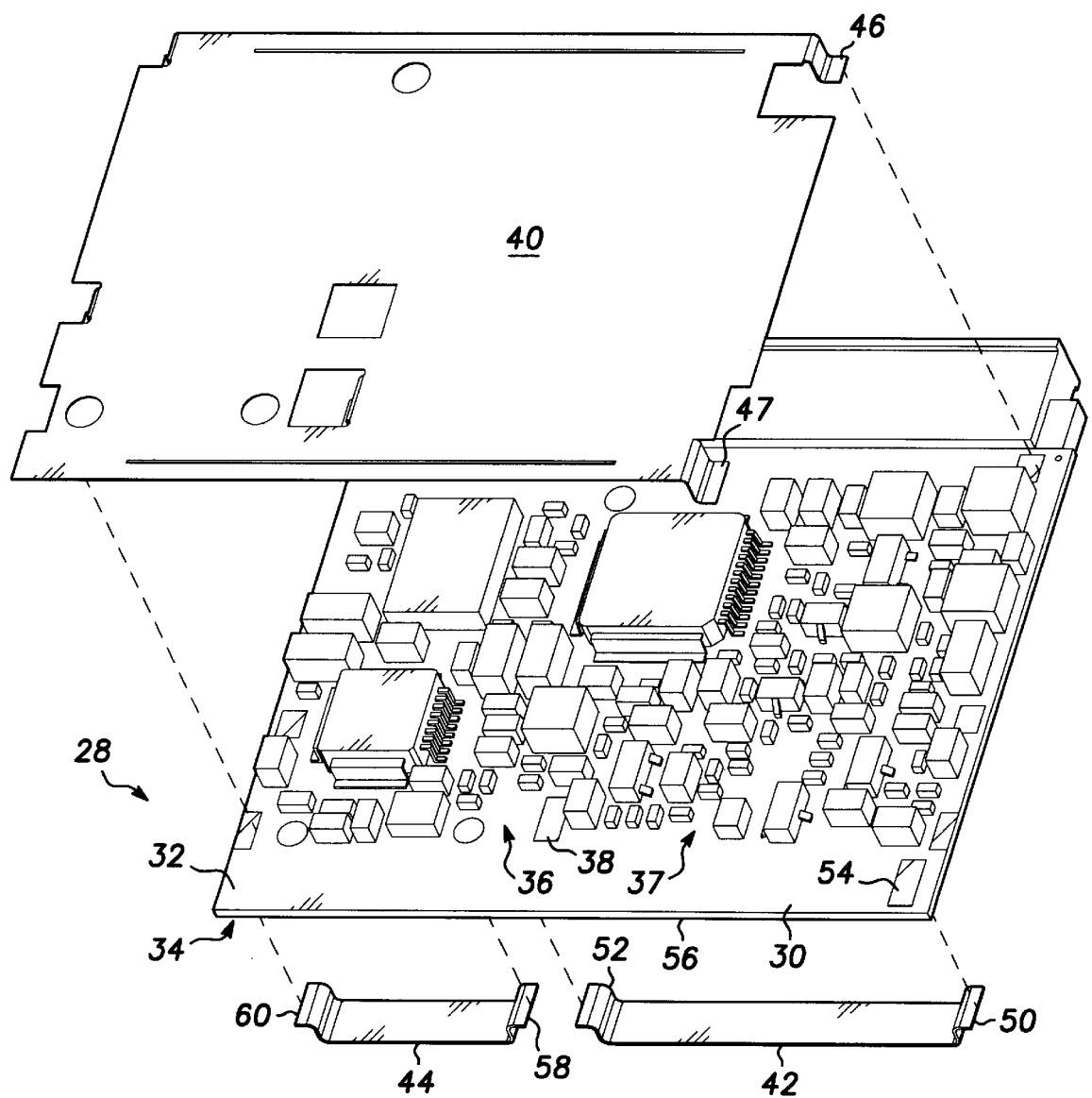
FIG. 3 is a perspective view of one embodiment of the wireless communication module of FIG. 1.

Referring to FIG. 3, a perspective view of the wireless communication module 10 including one embodiment of an antenna 28 and circuit board 30 assembly is illustrated. The circuit board 30 comprises a first side 32 and an opposite side 34, one or both sides carrying a plurality of electronic parts. The electronic parts include radio circuitry 36 such as RF and digital circuitry of a receiver 37 used for the operation of the wireless communication module 10. As is conventional, the radio circuitry 36 includes a ground 38. The antenna 28 preferably comprises a shield plate 40, an antenna loop element 42, and a transmission line element 44.

The antenna loop element 42 is located on the opposite side 34 of the circuit board 30. The antenna loop element 42 is a formed metal element, for example manufactured copper with bright acid tin plate, having a first loop end 50 and a second loop end 52 oppositely situated and both mechanically and electrically connected to the opposite side 34 of the circuit board 30. In a preferred embodiment, the circuit board 30 includes one or more via holes 54, and the first loop end 50 of the antenna loop element 42 is coupled to the shield plate 40 through the via holes 54. The via holes 54 may be, for example, three holes in close proximity to the first loop end 50. Preferably, a first corner leg 47 of the shield plate 40 is soldered to the via holes 54 on the first side 32 of the circuit board 30, and the first loop end 50 of the antenna loop element 42 is soldered to the via holes 54 on the opposite side 34 of the circuit board 30. The soldered connections coupling through the via holes 54 to create an electrical connection between the shield plate 40 and the antenna loop element 42. The antenna loop element 42 is preferably located on an edge 56 of the circuit board 30 and over the shield plate 40.

The transmission line element 44 is located on the opposite side 34 of the circuit board 30. The transmission line element 44 is a formed metal element, for example manufactured from copper with bright acid tin plate, having a first transmission line end 58 and a second transmission line end 60 oppositely situated. Both the first transmission line end 58 and the second transmission line end 60 are mechanically and electrically connected to the opposite side 34 of the circuit board 30.

Figure 4:
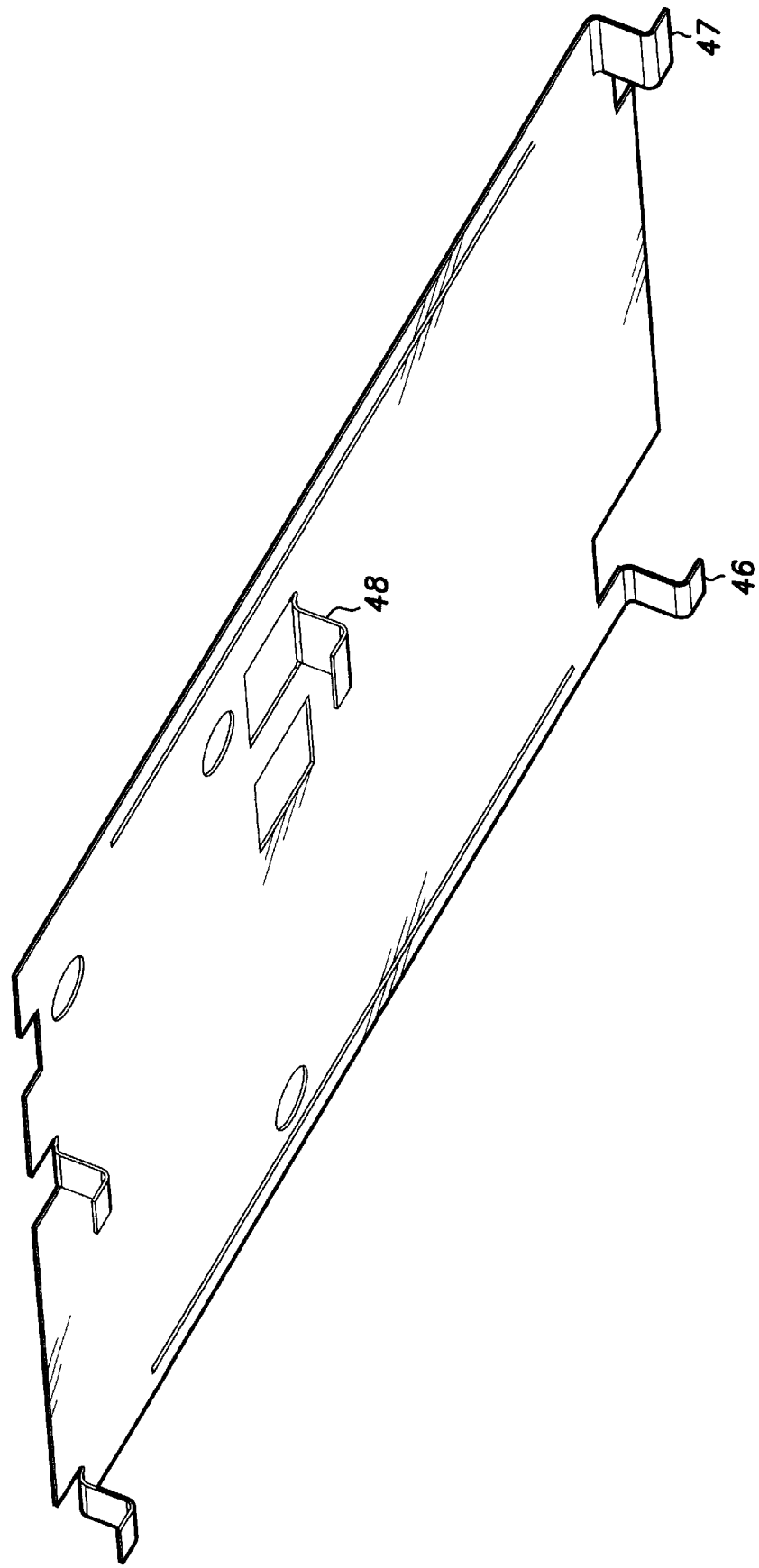
FIG. 4 is an illustration of a shield plate for use within the wireless communication module of FIG. 3.

The shield plate 40 is preferably located on the first side 32 of the circuit board 30. As illustrated in FIG. 4, the shield plate 40 is a formed sheet metal element, for example manufactured from copper with bright acid tin plate, and has at least one corner leg 46 to mechanically connect it to the first side 32 of the circuit board 30. Preferably, the shield plate 40 also includes a shield plate leg 48 mechanically connected to the circuit board 30 and electrically connected to the ground 38 of the radio circuitry 36 on the circuit board 30. For example, the ground 38 may be the ground of the radio frequency amplifier circuit or front-end circuit of the radio circuitry 36.

The shield plate 40 is multifunctional. The shield plate 40 functions as a shield against EMI emissions from circuitry of the electronic computing device 11 and also functions as an element of the antenna 28.

FIG. 5 illustrates an embodiment of the opposite side 34 of the circuit board 30 including the antenna loop element 42 and the transmission line element 44. A capacitor 64 mounted on the circuit board 30 interconnects the first transmission line end 58 of the transmission line element 44 to the second loop end 52 of the antenna loop element 42. The second transmission line end 60 is open ended and electrically floating. Preferably, the transmission line element 44 and the antenna loop element 42 are longitudinally aligned. Further the transmission line element 44 is located on the edge 56 of the circuit board 30 and over the shield plate 40.

For example, when the wireless communication module 10 is a message card designed to fit into the accessory slot located at the top edge 13 of the electronic computing device 11, the edge 56 of the circuit board 30 is similarly situated to the top edge 13 of the electronic computing device 11.

Figure 6:
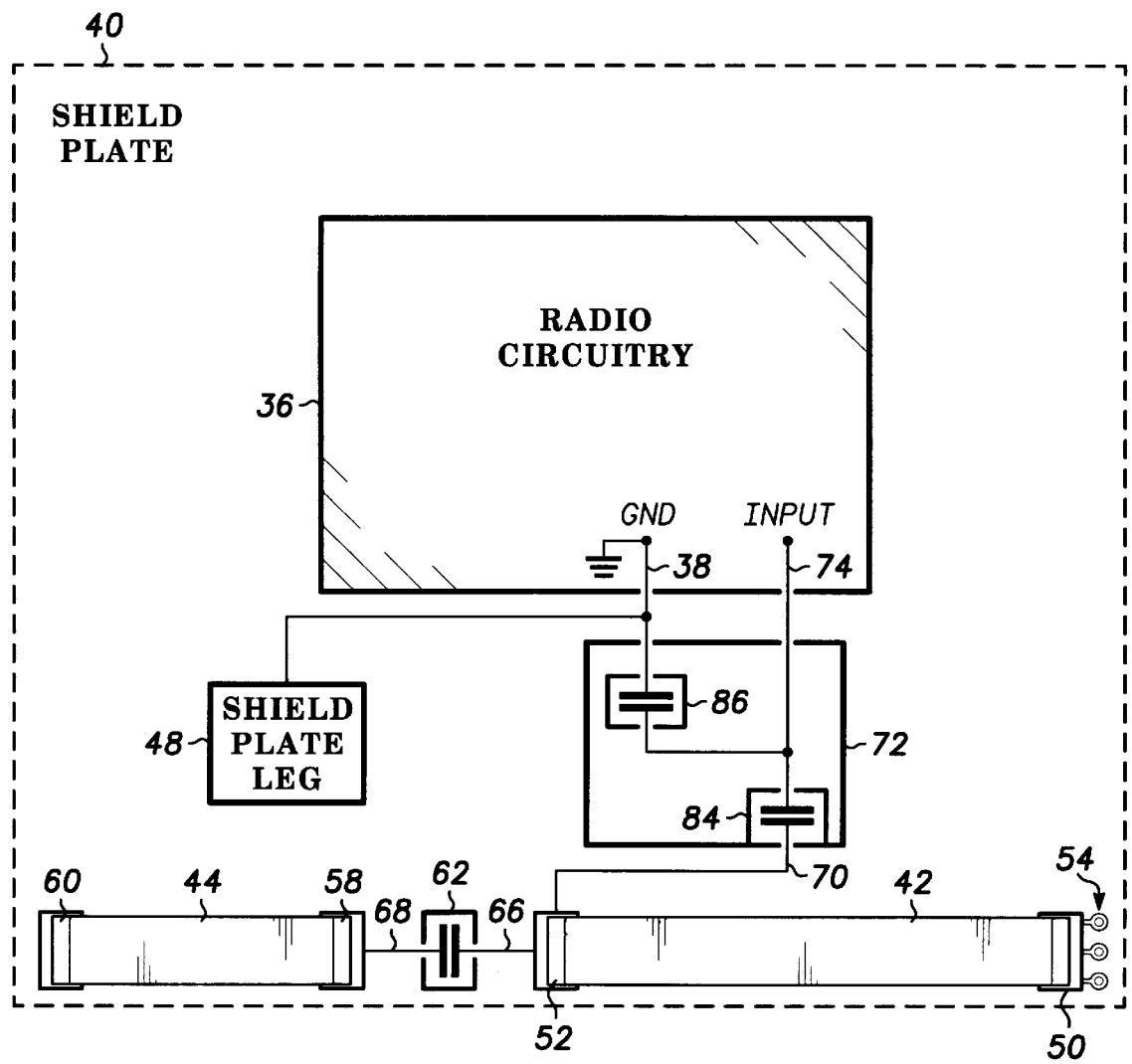
FIG. 6 is an electrical block diagram of an antenna used in the wireless communication module of FIG. 3 in accordance with the present invention.

The electrical connections and operation of the antenna 28 can be best understood by reference to the electrical block diagram of FIG. 6. The shield plate 40 is located on the first side 32 of the circuit board 30 and connected on the edge 56 of the circuit board 30 through the via holes 54 to the first loop end 50 of the antenna loop element 42. The shield plate 40 is grounded by electrically connecting the shield plate leg 48 to the ground 38 of the radio circuitry 36. The ground 38 preferably is located on the first side 32 of the circuit board 30.

A capacitive coupling element 62 interconnects the first transmission line end 58 of the transmission line element 44 to the second loop end 52 of the antenna loop element 42. One side of the capacitive coupling element 62 is connected to the second loop end 52 of the antenna loop element 42 through a first circuit trace 66 on the circuit board 30 and the other side of the capacitive coupling element 62 is connected to the first transmission line end 58 of the transmission line element 44 through a second circuit trace 68 on the circuit board 30. The capacitive coupling element 62 is preferably the capacitor 64 as illustrated in FIG. 5. Alternatively, the capacitive coupling element 62 may be the coupling between the second loop end 52 of the antenna loop element 42 and the first transmission line end 58 of the transmission line element 44. The capacitive coupling element 62 may also be the coupling between two or more conductive traces on the circuit board 30. The second transmission line end 60 of the transmission line element 44 is electrically floating. The antenna 28 is thus formed by the combination of the shield plate 40, the antenna loop element 42, and the transmission line element 44.

The antenna 28 is preferably connected through a third circuit trace 70 to a matching circuit 72 that matches the output of that combination with an input 74 of the radio circuitry 36. The input 74 typically presents a nominal 50 ohm impedance with reference to the ground 38 of the radio circuitry 36. The matching circuit 72 comprises a first matching capacitor 84 and a second matching capacitor 86. The first matching capacitor 84 is electrically connected in series between the second loop end 52 of the antenna loop element 42 and the input 74 of the radio circuitry 36. The second matching capacitor 86 is electrically connected in series between the input 74 of the radio circuitry 36 and the ground 38 of the radio circuitry 36. The matching circuit 72 is optimized for impedance matching and resonant frequency.

In the preferred embodiment, the capacitive coupling element 62 is a capacitor 64 with a fixed value of approximately 0.5 pico farad, the first matching capacitor 84 is variable between 1.0 and 2.5 pico farads, and the second matching capacitor 86 is variable between 2.5 and 10.0 pico farads. The values of the capacitor 64, the first matching capacitor 84 and the second matching capacitor 86 allow for the tuning and adjustment of the loop resonant frequency of the antenna within the range 929 to 932 MHz. It will be apparent to those skilled in the art that other ranges of loop resonant frequencies are attainable using different values for these components.

In the preferred embodiment, the shield plate 40, the antenna loop element 42, and the transmission line element 44 are made from a flat conductive material such as beryllium copper. The beryllium copper is plated to protect the base material and to provide ends suitable for soldering or similarly joining to the circuit board 30.

Figure 7:
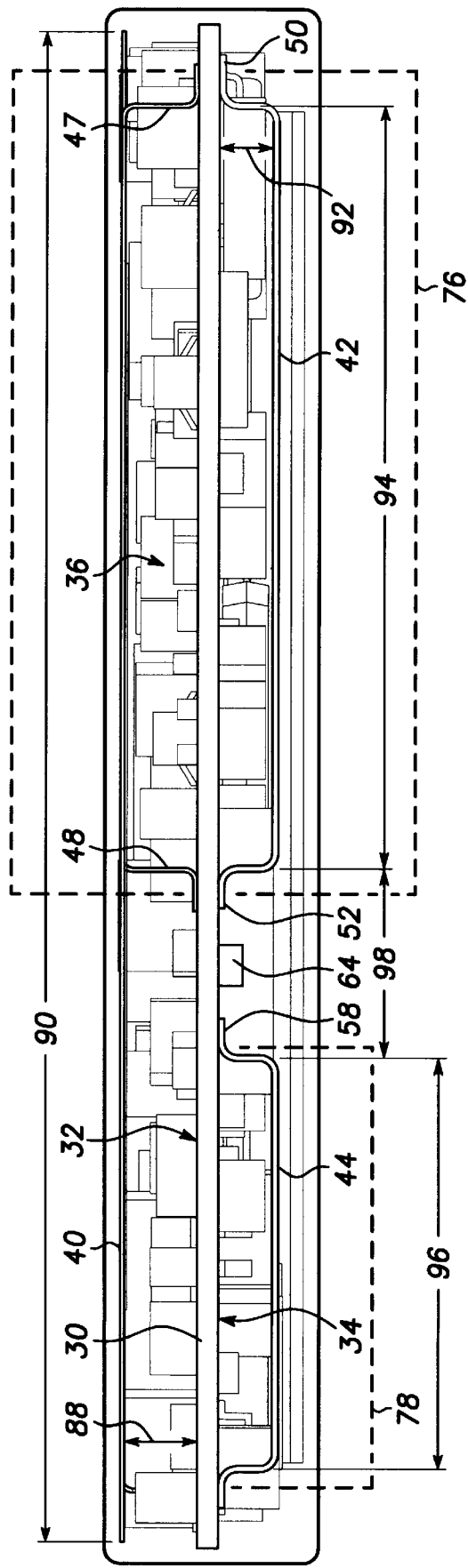
FIG. 7 is a cross-sectional view of the wireless communication module of FIG. 3 in accordance with the present invention.

FIG. 7 is a cross-sectional view of the wireless communication module 10. The shield plate 40 is formed by stamping out flat conductive material into the desired shape and then bending the material to form legs such as the first corner leg 47 and the shield plate leg 48 for mechanical and electrical connection to the circuit board 30. In the preferred embodiment, the legs of the shield plate 40, including the first corner leg 47 and the shield plate leg 48, are of sufficient length to locate the shield plate 40 at a maximum available plate distance 88 from the first side 32 of the circuit board 30. A plate length 90 is maximized, preferably covering all of the radio circuitry 36 on circuit board 30.

The antenna loop element 42 is formed by bending flat conductive material into a shape similar to three sides of a rectangle. The first loop end 50 and the second loop end 52 are pre-formed for soldering onto the opposite side 34 of the circuit board 30. The first loop end 50 and the second loop end 52 are of sufficient length to locate the antenna loop element 42 at a maximum available loop distance 92 from the opposite side 34 of the circuit board 30.

Similar to the antenna loop element 42, the transmission line element 44 is formed by bending flat conductive material into a shape similar to three sides of a rectangle. The first transmission line end 58 is pre-formed for soldering onto the opposite side 34 of the circuit board 30. The first transmission line end 58 is of sufficient length to locate the transmission line element 44 at a distance similar to the maximum available loop distance 92 of the antenna loop element 42 from the opposite side 34 of the circuit board 30.

There is a gap 98 located between the first transmission line end 58 and the second loop end 52. Varying the size of the gap 98 varies antenna performance. An antenna loop length 94 plus a transmission line length 96 plus the gap 98 are similar to, but not necessarily equivalent to, the plate length 90.

Together, the shield plate 40 coupled to the antenna loop element 42 form an H-field antenna 76. The transmission line element 44 forms and E-field antenna 78. The combined H-field antenna 76 and E-field antenna 78 greatly improve performance of the wireless communication module 10 when integrated within the electronic computing device 11.

The present invention improves performance of wireless communication modules integrated into electronic computing devices with minimal intrusion into the design of the electronic computing device. As an example, an antenna according to the present invention for a wireless communication module designed to fit into the compact flash slot of a personal digital assistant outperformed typical free field performance specifications. Typical dimensions of such an antenna include a combined loop distance 92 plus plate distance 88 of 5.08 millimeters, an antenna loop length 94 of 18.80 millimeters, a gap 98 of 4.0 millimeters, and a transmission line length 96 of 13.2 millimeters.

FIG. 8 illustrates another embodiment of the antenna 28 of the present invention. The reference numbers of the embodiment of FIGS. 3 through 7 have been retained for those elements which are common. In the embodiment illustrated in FIG. 8, the opposite side 34 of the circuit board 30 includes a plurality of conductive traces 102. The antenna embodiment of FIG. 8 is essentially similar to the antenna 28 of FIGS. 3 through 7 with the exception of the formation of the antenna loop element 42 and the transmission line element 44. In the antenna embodiment of FIG. 8, the antenna loop element 42 is formed by a first set of conductive traces 104, and the transmission line element 44 is formed by a second set of conductive traces 106. The conductive traces 102, 104, and 106 may, for example, be made of copper.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. In a wireless communication module having a circuit board with a first side and an opposite side, an antenna for electromagnetic interference suppression comprising:

a shield plate located on the first side of the circuit board;

an antenna loop element located on the opposite side of the circuit board and having a first loop end and a second loop end, wherein the first loop end is coupled to the shield plate;

a transmission line element located on the opposite side of the circuit board and having a first transmission line end and a second transmission line end, wherein the second transmission line end is open ended; and a capacitive coupling element interconnecting the first transmission line end to the second loop end.

2. An antenna for electromagnetic interference suppression in a wireless communication module as recited in claim 1 wherein the wireless communication module includes radio circuitry mounted on the circuit board, the antenna further comprising:

a matching circuit coupled to the second loop end and interconnected to the radio circuitry.

3. An antenna for electromagnetic interference suppression in a wireless communication module as recited in claim 2 wherein the shield plate includes a shield plate leg, wherein the radio circuitry includes a ground, and further wherein the shield plate leg is coupled to the ground of the radio circuitry.

4. An antenna for electromagnetic interference suppression in a wireless communication module as recited in claim 1 wherein the transmission line element and the antenna loop element are longitudinally aligned along an edge of the circuit board.

5. An antenna for electromagnetic interference suppression in a wireless communication module as recited in claim 1 wherein the opposite side of the circuit board includes a plurality of conductive traces on its surface, and further wherein the antenna loop element is formed by a first set of conductive traces.

6. An antenna for electromagnetic interference suppression in a wireless communication module as recited in claim 1 wherein the opposite side of the circuit board includes a plurality of conductive traces on its surface, and further wherein the transmission line element is formed by a second set of conductive traces.

7. In a wireless communication module having a circuit board with a first side and an opposite side, and having radio circuitry mounted on the circuit board, an antenna for electromagnetic interference suppression comprising:

a shield plate located on the first side of the circuit board;

an antenna loop element located on the opposite side of the circuit board and having a first loop end and a second loop end, wherein the first loop end is coupled to the shield plate through one or more via holes in the circuit board;

a transmission line element located on the opposite side of the circuit board and having a first transmission line end and a second transmission line end, wherein the second transmission line end is open ended;

a capacitive coupling element interconnecting the first transmission line end to the second loop end; and a matching circuit coupled to the second antenna loop end and interconnected to the radio circuitry.

8. An antenna for electromagnetic interference suppression in a wireless communication module as recited in claim 7 wherein the shield plate includes a shield plate leg, wherein the radio circuitry includes a ground, and further wherein the shield plate leg is coupled to the ground of the radio circuitry.

9. An antenna for electromagnetic interference suppression in a wireless communication module as recited in claim 7 wherein the transmission line element and the antenna loop element are longitudinally aligned along an edge of the circuit board.

10. In a wireless communication module having a circuit board with a first side and an opposite side, the opposite side of the circuit board including a plurality of conductive traces on its surface, the wireless communication module having radio circuitry mounted on the circuit board, an antenna for electromagnetic interference suppression comprising:

a shield plate located on the first side of the circuit board;

an antenna loop element located on the opposite side of the circuit board and formed on the surface of the opposite side by a first set of conductive traces, the antenna loop element having a first loop end and a second loop end, wherein the first loop end is coupled to the shield plate;

a transmission line element located on the opposite side of the circuit board and formed on the surface of the opposite side by a second set of conductive traces, the transmission line element having a first transmission line end and a second transmission line end, wherein the second transmission line end is open ended;

a capacitive coupling element interconnecting the first transmission line end to the second loop end; and a matching circuit coupled to the second antenna loop end and interconnected to the radio circuitry.

11. An antenna for electromagnetic interference suppression in a wireless communication module as recited in claim 10 wherein the transmission line element and the antenna loop element are longitudinally aligned along an edge of the circuit board.

12. In a wireless communication module having a circuit board with a first side and an opposite side, and having radio circuitry including a ground mounted on the circuit board, an antenna for electromagnetic interference suppression comprising:

a shield plate located on the first side of the circuit board, wherein the shield plate includes a shield plate leg coupled to the ground of the radio circuitry;

an antenna loop element located on an edge of the opposite side of the circuit board and over the shield plate, the antenna loop element having a first loop end and a second loop end, wherein the first loop end is coupled to the shield plate through one or more via holes in the circuit board;

a transmission line element located on the edge of the opposite side of the circuit board and over the shield plate and longitudinally aligned along an edge of the circuit board with the antenna loop element, the transmission line element having a first transmission line end and a second transmission line end, wherein the second transmission line end is open ended;

a capacitive coupling element interconnecting the first transmission line end to the second loop end; and a matching circuit coupled to the second antenna loop end and interconnected to the radio circuitry.

13. In a wireless communication module having a circuit board with a first side and an opposite side, an antenna for electromagnetic interference suppression comprising:

a shield plate located on the first side of the circuit board, wherein the shield plate receives the electromagnetic interference as input;

an antenna loop element located on the opposite side of the circuit board and having a first loop end and a second loop end, wherein the first loop end is coupled to the shield plate, wherein the antenna loop element and the shield plate form an H-field antenna;

a transmission line element located on the opposite side of the circuit board and having a first transmission line end and a second transmission line end, wherein the second transmission line end is open ended, wherein the transmission line element forms an E-field antenna; and a capacitive coupling element interconnecting the first transmission line end to the second loop end.

14. A wireless communication module for integration into an electronic computing device having a top edge, the wireless communication module capable of receiving a transmission from a wireless communication system and comprising:

a receiver including radio circuitry and a ground mounted on the circuit board; and an antenna including:

a shield plate located on the first side of the circuit board, wherein the shield plate includes a shield plate leg coupled to the ground of the radio circuitry, an antenna loop element having a first loop end and a second loop end, wherein the first loop end is coupled to the shield plate, a transmission line element having a first transmission line end and a second transmission line end, wherein the second transmission line end is open ended, and a capacitive coupling element interconnecting the first transmission line end to the second loop end, wherein the antenna loop element, the transmission line element and the capacitive coupling element are located on an edge of the circuit board, and further wherein the edge of the circuit board and the top edge of the electronic computing device are similarly situated.

* * * * *